(12) United States Patent
Balasubramanian et al.

(10) Patent No.: US 8,683,115 B2
(45) Date of Patent: Mar. 25, 2014

(54) PROGRAMMABLE MAPPING OF EXTERNAL REQUESTORS TO PRIVILEGE CLASSES FOR ACCESS PROTECTION

(75) Inventors: Dheera Balasubramanian, Richardson, TX (US); Joseph R. M. Zbiciak, Arlington, TX (US)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 13/239,027

(22) Filed: Sep. 21, 2011

(65) Prior Publication Data

US 2012/0198192 A1    Aug. 2, 2012

Related U.S. Application Data

(60) Provisional application No. 61/387,283, filed on Sep. 28, 2010.

(51) Int. Cl.
*G06F 13/00* (2006.01)
*G06F 13/28* (2006.01)

(52) U.S. Cl.
USPC ............... 711/103; 711/163; 711/E12.093; 726/26

(58) Field of Classification Search
USPC ............. 711/103, 163, E12.093; 726/26
See application file for complete search history.

(56) References Cited

U.S. PATENT DOCUMENTS

2006/0242150 A1* 10/2006 Jogand-Coulomb et al. ..... 707/8

* cited by examiner

*Primary Examiner* — Edward Dudek, Jr.
(74) *Attorney, Agent, or Firm* — Robert D. Marshall, Jr.; W. James Brady; Frederick J. Telecky, Jr.

(57) ABSTRACT

A memory management and protection system that manages memory access requests from a number of requestors. Memory accesses are allowed or disallowed based on the privilege level of the requestor, based on a Privilege Identifier that accompanies each memory access request. An extended memory controller selects the appropriate set of segment registers based on the Privilege Identifier to insure that the request is compared to and translated by the segment register associated with the master originating the request. A set of mapping registers allow flexible mapping of each Privilege Identifier to the appropriate access permission.

6 Claims, 6 Drawing Sheets

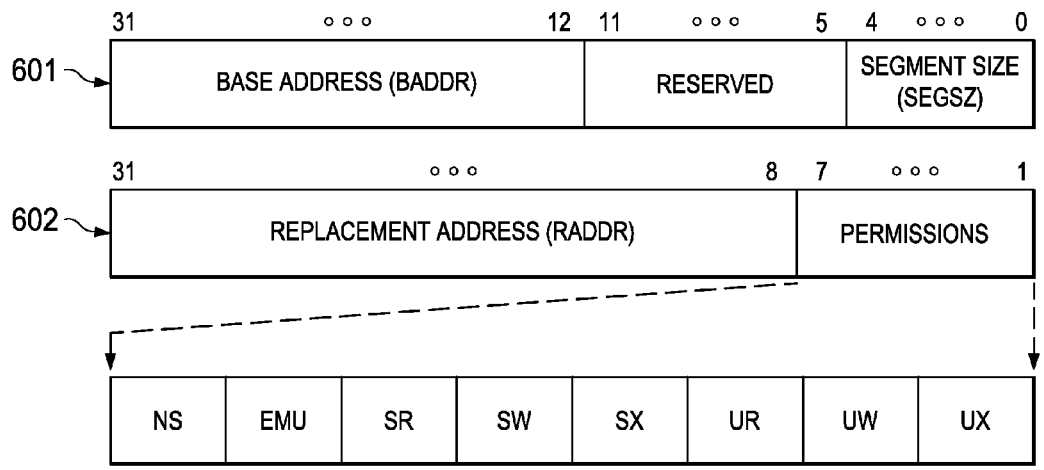

| 31 | 30 | ∘∘∘ | 3 2 | ∘∘∘ 0 |
|---|---|---|---|---|
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |
| NS | | RESERVED | | AID |

PROGRAMMABLE MAPPING OF EXTERNAL REQUESTORS TO PRIVILEGE CLASSES FOR ACCESS PROTECTION

TECHNICAL FIELD OF THE INVENTION

This invention relates in general to the field of computing systems and more particularly to memory management and protection.

BACKGROUND OF THE INVENTION

Current state of the art general purpose processors rely on memory management units (MMU) to provide both memory protection and address translation functions. The most typical memory management units provide a page-oriented architecture, usually fixed around a small number of different page sizes—4 KB only, 4 KB+64 KB, 4 KB+2 MB, etc. Memory management units are very flexible, but they suffer from multiple drawbacks:
   Complicated to design and verify.
   Variable performance depending on how the memory management unit is implemented. Most of the commonly used implementations can add significant uncertainty to memory system performance.
   For best performance, the memory management unit needs to be tightly integrated in the memory hierarchy, preferably at or near the CPU/L1 cache boundary. Once tightly integrated, it is difficult to remove, reducing the flexibility of the architecture to scale to meet cost and performance targets.
   A potentially large memory footprint is required for page table entries due to the small page sizes in big systems. For example, it takes 1,048,576 4 KB pages to fully map a 4 GB memory system.

An additional problem arises with conventional memory management units used in large, multiprocessor systems using 32 bit processor elements. While the logical address place for each processor or each task will still fit into a 32 bit address place, the physical address place of the memory system may exceed the 32 bit range. In this case an address translation unit is required that is capable of producing wider physical addresses than the logical addresses it started with, so that the total physical address space can be larger than the logical address space.

SUMMARY OF THE INVENTION

This invention describes a distributed memory management and protection system. In a complex multi processor system there are many parallel threads of execution, and many sources making memory requests ant any given time. In such a system the memory protection system must make decisions based on the privilege context associated with each request. These requests may come from a variety of sources like DMA controllers, but it is preferable to consider the CPU that originated the request instead of the immediate source.

In the described system each request is accompanied by a "Privilege Identifier" (PRVID). Smart masters, such as CPUs carry unique PRVIDs. "Deputy" masters such as DMA controllers inherit the PRVID of the originating CPU.

With multiple CPUs the PRVID may be used to select different sets of memory segments to match the memory map of the CPU. When the CPU initiates a DMA request, the DMA parameters will be compared against and translated by the appropriate CPUs set of segment registers.

A flexible mapping method is shown that allows arbitrary mapping of the PRVID to the Allowed ID (AID) of the memory segment.

BRIEF DESCRIPTION OF THE DRAWINGS

These and other aspects of this invention are illustrated in the drawings, in which:
FIG. 4 illustrates the instruction syntax of the very long instruction word digital signal processor core illustrated in FIG. 2 (prior art);
FIG. 5 illustrates the permission fields in the segment registers;
FIG. 6 illustrates the content of the segment registers,
FIG. 10 illustrates the flexible mapping registers.

DETAILED DESCRIPTION OF PREFERRED EMBODIMENTS

Figure 1:
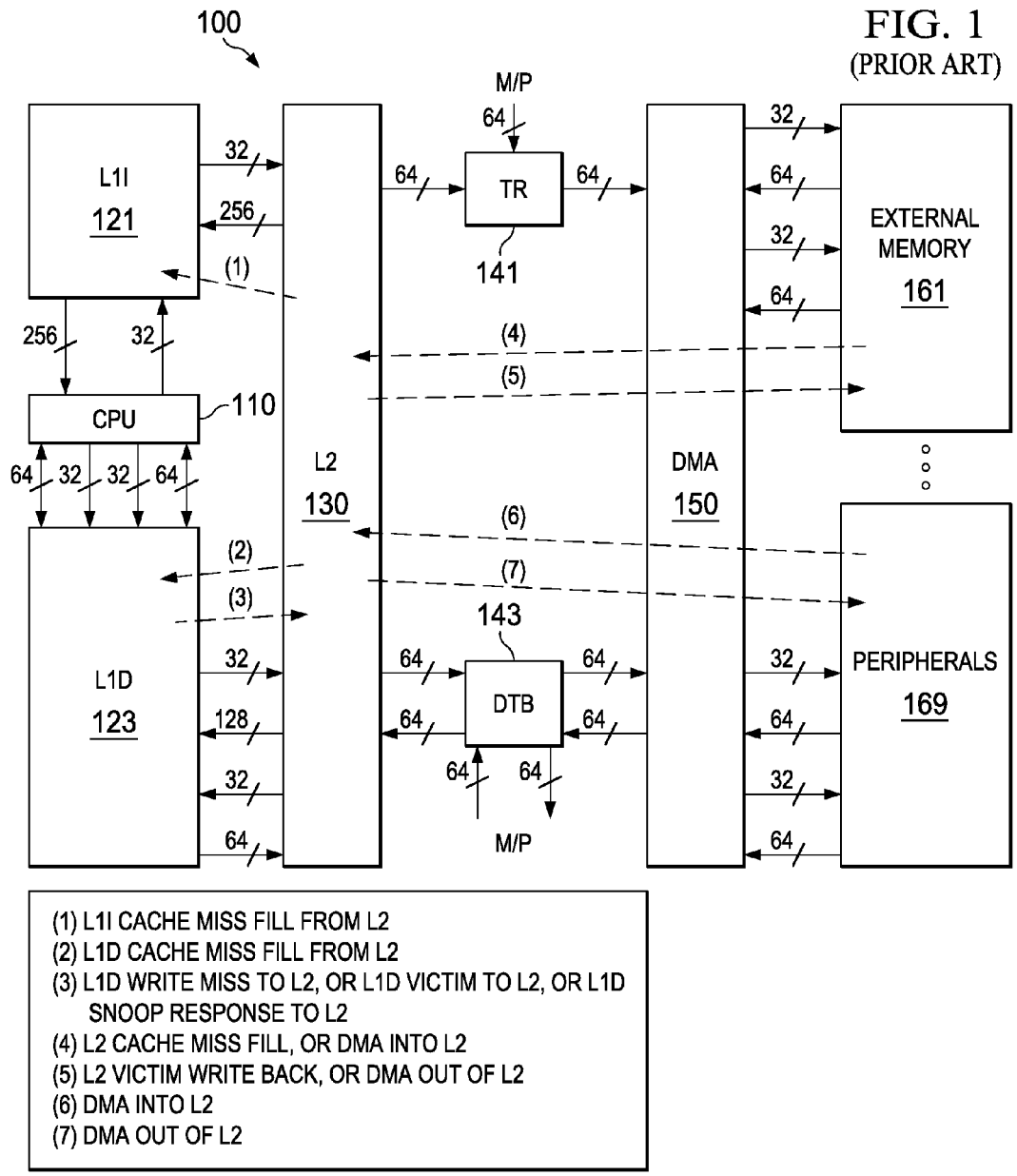
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

Figure 2:
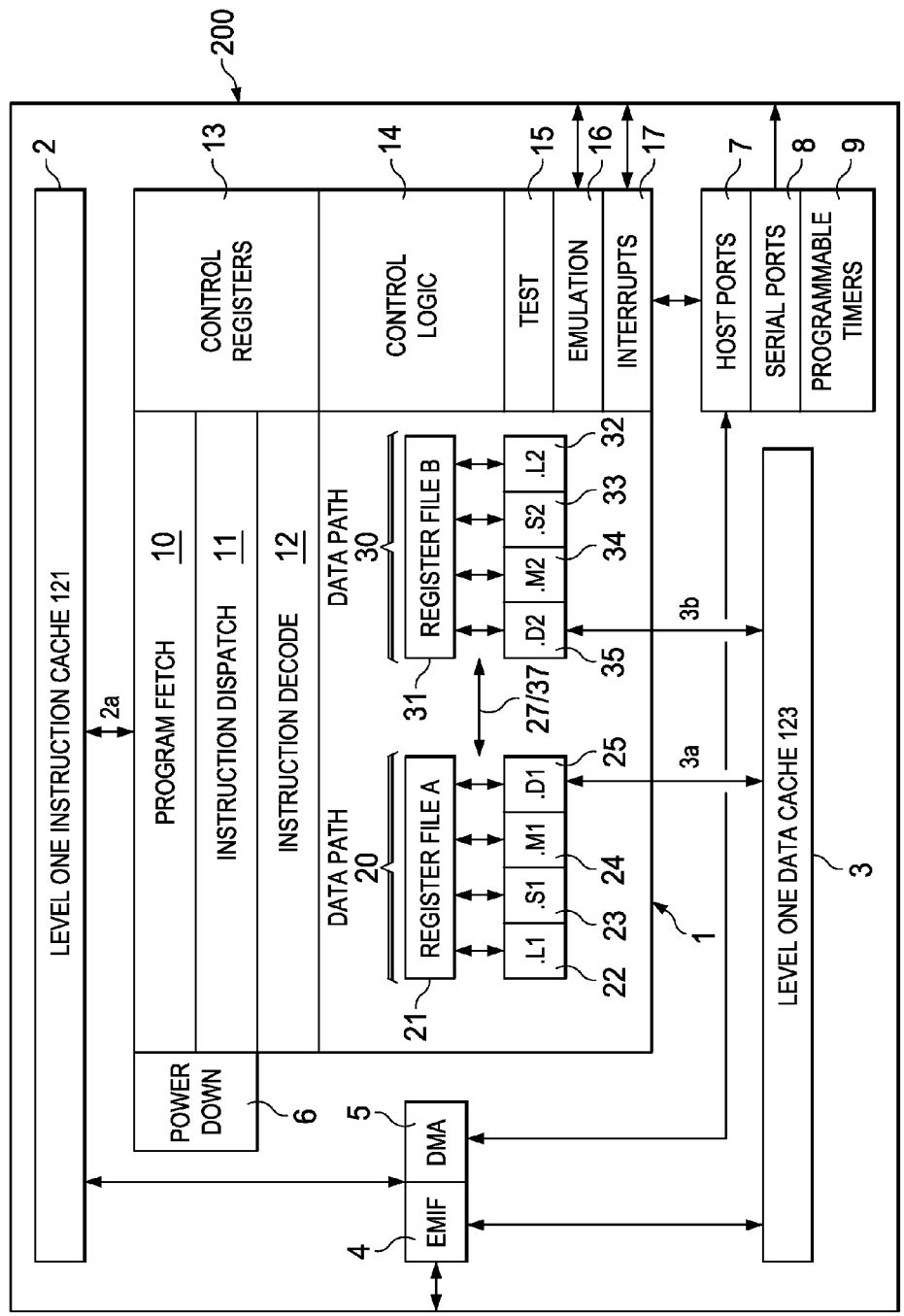
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
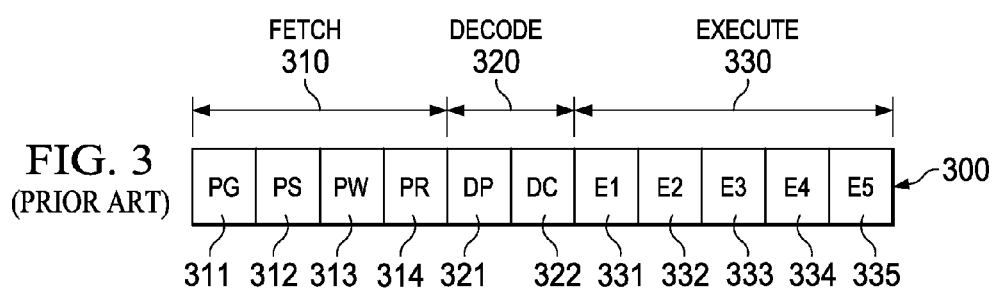
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional | creg | | | z |
|---|---|---|---|---|
| Register | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

Memory protection provides many benefits to a system. Memory protection functionality can:
  Protect operating system data structures from poorly behaving code;
  Aid in debugging by providing greater information about illegal memory accesses;
  Prevent unauthorized access to sensitive data (also known as device security); and
  Allow the operating system to enforce clearly defined boundaries between supervisor and user mode accesses, leading to greater system robustness.

To provide these benefits, the memory protection hardware must be suitably powerful and flexible.

The described memory protection architecture provides these benefits through a combination of CPU privilege levels and a memory system permission structure. Device security is also supported as an extension to the memory protection architecture, thereby allowing secure devices to be built within this framework.

The privilege of an execution thread determines what level of permissions that thread might have. This privilege is actually divided into two concepts: privilege Level and secure level.

Code running on the CPU executes in one of two privilege modes: Supervisor Mode or User Mode. Supervisor code is considered 'more trusted' than User code. Examples of Supervisor threads include operating system kernels and hardware device drivers. User threads are all end applications.

Supervisor Mode is generally granted access to peripheral registers and the memory protection configuration. User Mode is generally confined to the memory spaces that the operating system (OS) specifically designates for its use.

Requestors provide a single privilege bit alongside each memory access to indicate the privilege level associated with that access. The memory protection hardware uses this bit to determine what subset of the memory protection fields to examine. This bit is encoded as shown below:

| Privilege Level | Encoding |
|---|---|
| User | 0 |
| Supervisor | 1 |

CPU accesses as well as DMA and other accesses have a privilege level associated with them. CPU privilege level is determined as described above. DMA and other accesses initiated by the CPU inherit the CPU's privilege level at the time they are initiated. Mastering peripherals generally issue transfers with supervisor privileges, although the specific details depend on the peripheral.

On secure devices there is an additional axis to the privilege structure. A device which does not implement device security, or which has device security disabled is referred to as a non-secure device.

Threads of execution may be considered either secure or non-secure. Whereas the CPU's privilege level is purely an internal CPU mode, the secure level is a function both of the memory system configuration and the CPU mode. A thread of execution may be secure only if it is executing from a page of memory that is marked secure. The CPU can only branch to code in a secure page if it is already in secure mode. The CPU enters secure mode via an exception or an interrupt.

Secure mode privileges are always a superset of non-secure mode. Regions of memory that are marked as secure are not accessible to non-secure threads. Secure threads may access memory regardless of whether it is marked secure or not secure. This is in direct contrast to the independent permissions offered for supervisor vs. user, nothing requires or guarantees that supervisor has more privilege than user within a given page.

To the memory protection hardware, the secure mode looks like an additional privilege bit that comes in parallel with each access. On non-secure devices, this bit is hardwired so that all accesses look like Secure accesses. The encoding of this bit is as follows:

| Secure Level | Encoding |
|---|---|
| Not Secure | 0 |
| Secure | 1 |

As with Privilege levels, all CPU, DMA and other accesses have a secure level associated them. DMA accesses issued by a CPU inherit the CPU's Secure level, and other accesses are always treated as non-secure.

A non-secure device has two privilege levels, Supervisor and User. Such devices transition into Supervisor mode in response to interrupts and the Software Exception (SWE) instruction. All privilege transitions are strictly controlled within the CPU.

In the generic OS model, pages of memory are usually configured with minimal privileges. For instance, user data pages are configured as readable and writeable by the User, but not necessarily readable or writeable by the Supervisor. The same is true for code pages. Shared code pages are marked as executable by both Supervisor and User. Other executable pages are marked as executable by Supervisor or User exclusively.

This model provides a high level of error checking robustness against incorrect program code, errors due to corrupted pointers, and potential attacks against a system.

It is worth noting that Non-Secure in this context refers only to the lack of device level IP Security support. It makes no implication about the security of the OS against remote attacks. It only implies that the Intellectual Property (IP) stored on the device does not have hardware locks that prevent developer access or a determined attacker with physical access to the device from revealing the IP stored therein.

In such a model, operating system requests are made from User Mode in the following manner:

The User Mode task places any information it is passing to the OS in a memory page that is at a minimum readable to the Supervisor, and writeable by the User. (The page may or may not be readable by the User, and may or may not be writeable by the Supervisor);

The User Mode task constructs a set of arguments in registers and/or memory as noted above;

The User Mode task executes an SWE instruction.

In response to this sequence, the CPU transitions into Supervisor mode and begins executing the OS Exception Handler. The Exception Handler, upon recognizing a valid system call, performs the service call requested. If the OS must return a block of data to the user, it must do so via a page that is writeable to Supervisor, and readable by the User.

Such a model relies on the OS being somewhat trustworthy. While memory protection pages are set up to prevent Supervisor access to User pages whenever possible, this configuration is a matter of trust. The Supervisor may change the configuration of these pages at any time. The purpose of memory protection blocking Supervisor accesses in this case is to ensure that such accesses are deliberate as opposed to accidental or due to attempts (from hostile code) to subvert the supervisor. In the DSP-BIOS model, DSP-BIOS configures memory protections such that Supervisor permissions are always a superset of User permissions. The goal of this configuration is performance: Most operating system service calls avoid a costly switch into Supervisor mode, as a large portion of DSP-BIOS' code and data structures exist in User-mode space.

DSP-BIOS treats Supervisor as "fully trusted" mode. As a result, DSP-BIOS does not execute non-trusted User code in Supervisor mode. DSP-BIOS does not rely on hardware assistance to enforce this requirement, however. Rather, DSP-BIOS relies on the correctness of its own programming to not invoke untrusted code while in Supervisor mode. Note that restriction applies to untrusted User mode code. DSP-BIOS may invoke some of its own code from both Supervisor and User modes, since the code represents common library routines used both by the kernel and user-space.

In the embedded processor realm, it is common for hardware to provide a minimum of functionality, and for software to provide the rest. DSP-BIOS' memory protection model is designed for that paradigm.

On a Secure Device, the usage model differs somewhat. On these devices, the CPU enters Secure Supervisor mode on taking an interrupt or an exception. It leaves Secure mode by branching to a Non-secure page, and it leaves Supervisor mode via "B IRP"/"B NRP" instruction. Thus, privilege and secure-level transitions are a function of both CPU mode switches and memory system attributes.

The purpose of a Secure Device is to protect IP and sensitive data (e.g. credit card numbers, personal identification information) from exposure to hostile attackers, including those who have development equipment and physical access to the device.

In the Secure Device model, there exists a small Secure Kernel which has ultimate control over all memory protection entries, interrupt and exception handlers, and various Secure IP that is stored on the die. A separate OS can coexist with this kernel, but that OS runs with Non-secure Supervisor privileges.

Secure Devices have four privilege/security modes altogether. Table 2 illustrates these four modes and what they are typically used for under this model.

TABLE 2

|  | Secure | Non-Secure |
|---|---|---|
| Supervisor | Secure Kernel<br>Secure Loader<br>Secure IP License<br>Management | RTOS (DSP-BIOS or OSE) |
| User | Secure IP | Customer end applications |

In this model, the Real Time Operating System (RTOS) relinquishes some responsibilities to the Secure Kernel, such as configuring the Interrupt Service Table, a subset of the memory protection entries, and configuring the cache hierarchy.

The memory protection architecture described uses a distributed structure. The distributed model avoids memory protection bottlenecks in a large system by placing the controls with the resources being controlled, and each protected resource implements the memory protection hardware locally.

The architecture simply defines "resource" as "a peripheral or memory accessible through addresses in the memory map." This allows the same hardware within the resource to perform protection checks for all requestors to that resource, without bottlenecking on accesses to the protection hardware itself.

This approach has advantages and disadvantages. The advantages include a consistent view of memory protection attributes for all requestors in the system, and a lack of bottlenecks that might arise from centralized memory protection hardware. Disadvantages include the requirement that each peripheral (or hardware outside the peripheral) implement protection hardware and provide a CPU accessible register interface to that hardware.

Each endpoint can tailor its protection hardware to a small extent in order to implement the desired level of protection.

To support this distributed protection architecture and to support caches in such a system, additional sideband signaling must accompany each memory access. Most notably, the presence of cacheable memory shifts some of the burden on access control. Caches introduce a semantic disconnect between program accesses and the memory accesses which reach the target endpoint.

The memory protection architecture divides the memory map into pages, with each page having an associated set of permissions.

Memories typically have power of 2 page sizes that range in size from 1 K bytes to 16 M bytes. The page size chosen for a given pool of memory depends on the size of the memory, and the complexity of the memory controller. These power of 2 sized pages typically start and end at power of 2 boundaries equal to their size, although this is not a requirement.

Peripherals modify the notion of pages, using pages to cover unique resources within the peripheral. An example of unique resource might include separate channels on a multi-channel peripheral that implements separate register sets for each channel. Another example might be a range of locations in a DMA parameter associated with one or more channels.

As a result, pages do not have a uniform size, and might even cover discontinuous regions of the address space. Different resources may size their protection pages differently, according to the needs of the resource. For instance, a small L1 memory might use 1 KB pages, whereas a large off-chip memory might use 16 MB pages. A peripheral might define a 'page' that covers only a handful of registers. This range and variation in page sizes offer a balance between granularity of control and the cost of implementing the protection architecture.

For example, the L1 and L2 memory controllers select their page size based on a static configuration parameters. Other resources, such as peripherals with small, fixed address spaces, have inherently fixed page sizes.

Other resources may control large regions of the memory map, and addresses in these regions may be used in a variety of ways by the end system designers. Peripherals may act as proxies for resources outside the control of chip designer, and such peripherals should therefore support run-time programmable page sizes in order to tailor the memory protection to the needs of the system. Registers that control a peripheral's memory protection become part of the peripheral's memory mapped register set.

Hardware resources may also assign permissions to individual registers as required. These permissions may be fixed by the hardware, and might not be exposed to the programmer in a "page attribute" register. For instance, several cache control registers provided by unified memory controller (UMC), the data memory controller (DMC) and program memory controller (PMC) have fixed permissions, and no associated register for configuring those permissions.

The memory protection architecture defines a per page permission structure with three permission fields in a 16-bit permission entry. As shown in FIG. 5, bits 16 to 32 are reserved, bits 8 to 15 contain the Allowed IDs, bits 6 to 7 set the security and bits 0 to 5 define the Access types.

Each requestor on the device has an N-bit code associated with it that identifies it for privilege purposes. This code, referred to as the PrivID, accompanies all memory accesses made on behalf of that requestor. That is, when a requestor triggers a transfer directly, either by writing to DMA registers or by triggering the execution of a set of DMA parameters, the corresponding DMA engine will capture the requestors PrivID and provide that PrivID alongside the transfer.

Each memory protection entry has an allowed ID field associated with it that indicates which requestors may access the given page. The memory protection hardware maps the PrivIDs of all the possible requestors to the allowed IDs field in the memory protection registers. The allowed IDs field discriminates between the various CPUs, non-CPU requestors, and a given CPU's accesses to its own local memories.

When set to '1', the AID bit grants access to the corresponding PrivID. When set to '0', the AID bit denies access to the corresponding requestor. Table 3 gives the default mapping of the allowed ID bits to devices.

TABLE 3

| Bit | Definition |
|---|---|
| AID5 | Allow accesses from PrivID = 5 |
| AID4 | Allow accesses from PrivID = 4 |
| AID3 | Allow accesses from PrivID = 3 |
| AID2 | Allow accesses from PrivID = 2 |
| AID1 | Allow accesses from PrivID = 1 |
| AID0 | Allow accesses from PrivID = 0 |
| AIDX | Allow accesses from PrivID > = 6 |
| LOCAL | Allow access from CPU to its local memories (L1/L2 only) |

The above PrivID assignments for bits AID0 through AID5 apply to all DMA, IDMA and CPU memory accesses other than to the CPU's local L1 and L2 memories. The LOCAL bit governs CPU accesses to its own local L1 and L2 memories.

The AIDX bit maps to PrivIDs that do not have dedicated AID bits associated with them. It is intended but not required that this bit refers to external mastering peripherals, especially on systems with a large number of CPUs. If a given device must discriminate among external mastering peripherals, it can assign lower numbered PrivIDs to these peripherals.

As described the architecture only supports 6 unique PrivIDs. The remaining PrivIDs map onto a single AID. On devices that need to discriminate among more than 6 different requestors (CPUs and mastering peripherals), the AID field may be extended. Alternate useful mappings of PrivID to AID include:

Fixed N:1 groupings of PrivID to AID. This groups CPUs and requestors into 'clusters.' Such a mapping might be appropriate for a shared peripheral. For instance, a device with 12 CPUs might pair up the CPUs such that each AID bit corresponds to two CPUs.

Topological mapping. In this scheme, each CPU might employ a 1:1 mapping of PrivID to AID for a "global master" and a set of "logical neighbors," and an N:1 mapping for all other PrivIDs. For example, one might set up a mesh where each CPU has 3 neighbors, a global master, and all other CPUs map onto the remaining AID.

Run time programmable dynamic mapping. This method is the most flexible.

A device with many CPUs might employ a combination of these mapping schemes. As an example, one might cluster PrivIDs with N:1 mappings for shared peripherals while using a more topological approach for the CPUs themselves.

An expanded implementation of this invention introduces the concept of flexible mapping of the PRIVID bits to AID bits.

A set of 16, 32-bit Provid to Aid MAP (PAMAP) memory mapped configuration registers are provided where each register maps the 4-bit PRIVID value to the 3-bit AID value. These registers are shown in FIG. 10 where bits 0 to 2 represent the AID bits, bits 3 to 30 are reserved and bit 31 implements an additional level of memory protection. Bit 31 controls whether the associated PRIVID is allowed to initiate secure transactions into the memory system.

Table 4 shows the PRIVID to AID mapping encoding:

TABLE 4

| AID FIELD | MAPPING |
| --- | --- |
| 000 | Map this PrivID 0 to AID0 |
| 001 | Map this PrivID 1 to AID1 |
| 010 | Map this PrivID 2 to AID2 |
| 011 | Map this PrivID 3 to AID3 |
| 100 | Map this PrivID 4 to AID4 |
| 101 | Map this PrivID 5 to AID5 |
| 110 | Map this PrivID 6 to AIDX |
| 111 | Map this PrivID 7 to AIDX |

The PMAP registers are readable by all privilege and security levels, but are writeable only by secure supervisors on secure devices, or by supervisors an emulation on non secure devices.

To aid in code development and to add robustness to a system design, the memory protection architecture described distinguishes a CPU's accesses to its local memory from the DMAs it issues that access the same memory.

All requests issued by the CPU carry the CPU's PrivID as the ID of the requestor. This allows each peripheral to permit or deny the accesses according to the list of allowed IDs. In the case of accesses to a CPU's local L1 and L2 memories, it is useful to distinguish between the CPU's direct accesses to these memories and DMA accesses. Generally, applications will only devote a subset of the local memory to DMA activity, and DMA accesses outside these areas are incorrect accesses.

With respect to the allowed ID field, the architecture treats all remote CPUs accesses to a given module's memories identically to DMA accesses from that remote CPU. Therefore, the PrivID is used to determine the corresponding AID bit when considering remote accesses, and the LOCAL bit to determine whether the CPU may access its local memory.

In a complex system there are multiple threads of execution and multiple masters making requests at any given time. With a distributed memory protection system, it becomes necessary to make decisions and take memory management actions based on the privilege context associated with a request.

It is not sufficient to consider the master that made the request. For example, DMA controllers are masters, and make requests on behalf of multiple CPUs in the system. When it comes time to make a memory protection decision on a DMA request, it's more valuable to consider the CPU that programmed the DMA request than the fact it came from DMA.

In the described embodiment, each request is accompanied by a Privilege Identifier (PrivID). Smart masters, such as CPUs carry unique PrivIDs. Deputy masters, such as the DMA controllers inherit the PrivID of the component that programmed the DMA.

The PrivID may then select different sets of MPAX (Memory Protection and Address eXtension) segments to apply to requests. This lets each of the multiple CPUs in the system (4 or 8 in this embodiment) define the MPAX segments to match its image of the memory map. When a given CPU then requests DMA transfers, the DMA parameters (by virtue of inheriting that CPU's PrivID) will get compared against and translated by the appropriate CPU's set of segment registers in the Extended Memory Controller (XMC).

This method allows each of the smart masters to manage its own traffic without having to coordinate excessively with other smart masters. Furthermore, it allows each smart master to request as many DMAs as it requires, ignoring other masters as long as the DMAs inherit the privilege ID from the master that initiated the DMA.

This can be applied to any distributed memory protection architecture whereby primary masters can "deputize" secondary masters.

With this architecture, a program could designate a page as direct CPU access only by setting "LOCAL=1" and setting all other allowed IDs to zero. Conversely, a program could designate a page as "DMAs issued from this CPU only" by setting its AID bit and clearing the LOCAL bit. Such a setting can be useful in a paranoid environment such as a secure device, or in the context of a device driver. In most cases only the L1 and L2 memory controllers implement the LOCAL bit. In theory, a mastering peripheral that can make self-referential requests may also use the LOCAL bit, but in all likelihood such support is unnecessary. Nothing in the described architecture prevents such an implementation.

The described memory protection model defines three fundamental functional access types: Read, Write and Execute. Read and Write refer to data accesses—accesses originating via the load/store units on the CPU or via the DMA engines. Execute refers to accesses associated with program fetch. The memory protection model allows controlling Read, Write and Execute permissions independently for both User and Supervisor mode. This results in 6 permission bits, as shown in Table 4.

TABLE 5

| Bit | Description |
| --- | --- |
| SR | Supervisor may Read |
| SW | Supervisor may Write |
| SX | Supervisor may eXecute |
| UR | User may Read |
| UW | User may Write |
| UX | User may eXecute |

For each bit, a '1' permits the access type, and a '0' denies it. Thus "UX=1" means that User Mode may execute from the given page.

This method allows a small number of blanket permission settings to describe the general mapping requirements with coarse granularity for large ranges of system addresses without describing all of the fine details of the system.

In a single processor system, this approach is sufficient to insure protected memory accesses. However, in the multiprocessor shared memory system described there may be a number of processors with their own memory controllers interacting with one or more shared memories. While the memory management unit controlling the local shared memory has the required permission information for requests originating locally, it does not have adequate information regarding the permissions associated with the access requests originating with other processors. This invention implements a distributed protection approach to solve this problem.

On the first level, the MPAX unit may assign coarse, default permissions to a memory segment. As an example, it may allow read and execute but not write access to a segment, and these permissions will apply to all remote accesses to that memory segment irrespective of the source of the request.

The processor module originating the access request may need to modify these permissions through it's own memory management unit. As a further example, the process executing within the remote requestor may have execute, but not read or write permission. In order to insure that only allowed memory operations take place, the final permissions must take into consideration both the permissions assigned by the MPAX unit controlling the shared memory, and the permissions assigned by the memory controller originating the request.

Figure 9:
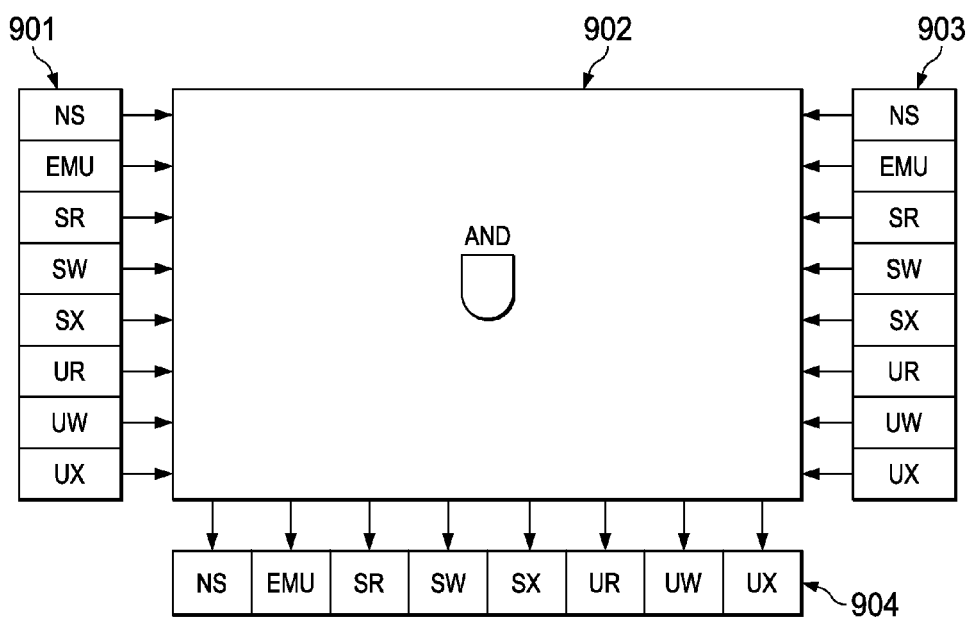
FIG. 9 illustrates an example of merging permission fields.

As shown on FIG. 9, this is accomplished by the MPAX unit controlling the shared memory by merging it's permissions with the permissions provided by the requestors as part of the request, by performing a logical AND operation between the two permissions. Register 901 is part of the segment register selected by the address of the request as shown on FIG. 6, and register 903 is the register holding the permission bits provided by the requestor. The contents of these registers are merged in AND block 902, resulting in the final permission bits shown in register 904. The local MPAX unit will use the merged permissions in forming the decision whether to grant access to the request or not. The meanings of the various permission bits are described in Tables 4 and 5. Requestors that do not perform permission checks will return all 1's thus not modifying the local MPAX permissions.

The DMC and UMC perform the fine-grain access-type checks for accesses that result in cache line fills, not the peripheral. The peripheral just makes a coarse grain check to ensure that "any" access is possible. Further, the peripheral does not perform fine-grain access-type checks for cache writebacks. Rather, the peripheral only checks that the region of memory is minimally writeable.

By default, the architecture permits emulation accesses to pages, regardless of the settings in the allowed ID and access type fields. While this is appropriate for typical debug environments, it is not appropriate for a secure device.

To support Secure devices, the NS and EMU bits indicate the security configuration of the page. Table 5 illustrates the encoding of these two bits:

TABLE 6

| NS | EMU | CPU Effects | Emulation Effects |
|---|---|---|---|
| 0 | 0 | Page is secure. Only Secure mode may access this page. Secure code executing within this page retains its secure status. | EDI reads/writes to this page are NOT permitted. Emulation halts and trace are NOT permitted when executing from this page. |
| 0 | 1 | Page is secure. Only Secure mode may access this page. Secure code executing within this page retains its secure status. | EDI reads/writes to this page ARE permitted. Emulation halts and trace ARE permitted when executing from this page. |
| 1 | x | Page is not secure. Both Secure and Non-secure code may access this page. Secure code may branch to this page, but upon doing so it will lose its Secure status. | EDI reads/writes to this page ARE permitted. Emulation halts and trace ARE permitted when executing from this page. |

Setting 'NS=1' makes the page 'not secure.' Both secure supervisor and non-secure supervisor mode may modify the permissions for this page. Setting 'NS=0' marks the page 'secure.' Only secure supervisor CPU accesses may modify the permissions secure pages. Only Secure supervisor code may mark a page as secure by setting NS=0.

The EMU bit allows for debugging secure code. When NS=1, the hardware ignores the EMU bit. When NS=0, the hardware disables emulation for that page unless EMU=1. Specifically, when NS=0 and EMU=0, the hardware:

Blocks all EDI accesses to the affected page;
Blocks emulation accesses through secondary routes;
When the CPU executes secure code from a page with NS=0 and EMU=0, it:
  Prevents emulation from halting code when the CPU executes from the secure page. The CPU ignores both software and hardware breakpoints. (This is the equivalent of "Run Free");
  Prevents emulation from tracing code or events generated by that code.

When either NS=1 or EMU=1, the hardware permits full emulation access to the page. Trace and breakpoints function normally allowing the debugging of secure code. This helps the most for debugging program issues that arise when modifying an otherwise correct algorithm to work in secure mode. On non-secure devices, the architecture forces NS to always be 1, thereby preventing unwanted operation.

While the above emulation architecture will give the programmer a consistent view between emulation debugging of the program and normal execution of the program, it does not allow for the arbitrary inspection of the entire physical memory map. In order to enable this, a XEDIAX (eXtended memory controller, Emulation Data Interface, Address eXtension) window may be implemented.

What makes this window unique is that it's truly parallel to anything the user's program might try to do. A section of arbitrary logical address space (0801_0000 through 0801_FFFF in the present embodiment) may be cordoned off as "emulation only." In other words, we now have 16 dedicated functional segments with programmable size, base address and replacement, and 1 dedicated emulation segment with a fixed size and fixed base address and only programmable replacement.

There is no possible way for functional application code to influence this emulation-dedicated memory resource without generating fake debugger requests. This means that the debugger will always have a means of displaying the entire *physical* address map, regardless of what the application has configured for everything else.

Software must define the mechanism for setting/clearing EMU on secure pages. A secure authentication algorithm, likely embedded in a ROM on a secure device, should perform this operation. Developers debugging secure code would then run a short sequence of code on the target to invoke this mechanism. A debugging environment could automate such an unlocking sequence by downloading and executing a short, predefined code sequence along with authentication data that the system requires.

When it encounters an invalid access, the memory protection hardware has two distinct duties:

Prevent the access from occurring,

Report the error to the operating environment.

Invalid accesses are those memory accesses which require greater permissions than those specified for the page or register involved. When presented with an invalid access, the memory protection hardware must prevent the requestor from making the access. What this means specifically varies with the hardware being protected, and whether the request originated from a cache controller. The guiding principle that the memory protection hardware must uphold can be summarized in one statement: The memory or peripheral being protected must not change in state due to an invalid access.

The hardware must always drop invalid writes. Invalid writes must never modify memory or change the status of a peripheral.

The hardware must never allow illegally read data to reach the requestor. Further, if the read would cause side-effects (that is, update the state of a peripheral, such as a FIFO or a status bit), the hardware must prevent those side-effects from occurring. The read may return garbage, so long as the garbage is unrelated to the contents of the memory being accessed.

An incorrect access may change some of the cache's internal state, so long as it does not change the semantic meaning of the cache's contents. Specifically, when a cache encounters an invalid access:

The cache may update its LRU;

The cache may allocate and/or evict lines;

The cache may not mark lines 'dirty';

The cache may not change the contents of the cache line.

Upon detecting an invalid access, the memory protection hardware must report the error to as appropriate. The memory protection hardware generates exception signals that are routed to an interrupt/exception selector block, and the selector then routes these exceptions to one or more CPUs. Only CPU, peripheral and DMA accesses to protected resources generate exceptions.

Emulation accesses never generate exceptions, rather they generate unique debug access status (DAS) codes. The architecture always permits emulation accesses unless the page has both NS=0 and EMU=0 (or equivalent, in the case of control registers with fixed implicit permissions).

Each peripheral which implements memory protection checks provides at least one exception output for signaling privilege violations. When the protection hardware detects a fault, it records the information regarding the fault and signals an exception. Under most circumstances, it does not record new faults or signal new exceptions until the supervisor clears the initial fault. Hardware which implements the LOCAL bit has an additional notion of "local" versus "remote" exceptions. Such hardware allows local faults to replace the information recorded for a remote fault, and subsequently trigger a new exception.

Each peripheral may provide more than one exception output, in order to signal different exceptions based on the faulting requestor, or some other aspect of the request. Indeed, the DMC, PMC and UMC specify separate exception outputs for local vs. global faults When a given piece of memory protection hardware detects a privilege violation, it captures some basic information about the violation as part of the exception-triggering process. Specifically, it captures the address of the fault, and the type of access that generated the fault. Invalid emulation accesses never generate memory protection exceptions. Rather, the memory controller reports the fault to emulation through special debug access status (DAS) codes.

The Memory Protection and Address eXtension (MPAX) unit addresses the needs above with a segment-based protection and translation scheme that has the following features:

Small, fixed number of segments (8 and 16 in our initial embodiment):

Programmable power of two segment size (4 KB through 4 GB in initial embodiment):

Programmable permissions per segment (rather than segments dedicated by purpose);

Strict priority between segments whose logical addresses overlap;

Support for merging segment permissions with permissions returned from remote endpoints. This allows stacking various protection units in a distributed system;

Replacement address associated with each segment can have more bits than the logical address bits it replaces, thereby supporting a large physical address space.

Benefits of this approach include:

Complex and compact mappings possible with small number of segments, thanks in part to priority scheme;

Enables a distributed protection scheme that scales up to the needs of a complex system, but which can be scaled down for or omitted from cost sensitive devices. Multiple MPAX units or other firewalls/protection mechanisms can exist along the path to a given endpoint, each providing its say (and potentially translation) over whether and how the access can proceed;

Physical address space on a large system can be sized to cover the overall memory requirements of the entire system, while the individual processors can stick with 32-bit addressing internally, thereby avoiding changing their datapaths;

Because the segments have dedicated storage, the segment descriptors do not compete for memory space, and the maximum cost of an MPAX lookup, permission check and address translation can be performed in 2 clock cycles. In some cases, part of the lookup can be avoided, reducing this to 1 clock cycle;

One can alias the same physical memory at multiple logical addresses, as there are no constraints on the logical-to-physical translation other than page size and address alignment. This can be useful in the context of a processor megamodule that assigns memory attributes (cacheability, prefetchability, writethrough) on the basis of logical address;

The MPAX registers may also be used to redirect requests from a master port back to a slave port via the system-level interconnect to facilitate embedded functional testing.

Device security in a shared memory system refers to the concept of supporting truly secure regions of memory and truly secure code execution, where the chain of trust extends from a known boot image up through the actual secure code execution, and through access to secure resources.

In the described system security starts with a secure boot ROM and a set of security keys programmed into eFuse. The secure boot ROM puts the system into a known state, and erases potentially sensitive data from the RAM before allowing code execution.

Additional rules are implemented in the MPAX unit to ensure that security can not be subverted by the memory protection and address translation functions:

Only a secure supervisor can change the security level of any given segment. As segments have a strict priority, a secure supervisor can claim the highest priority segments for itself.

Non-secure memory requests that match a secure segment generate an access fault.

Secure memory requests that match a non-secure segment get demoted to non-secure status. As non-secure space controls the address mapping of non-secure segments, the purpose here is to prevent a bug or malicious code to attempt secure access to a logical address whose mapping is controlled by non-secure space. The secure level of a request leaving the XMC should match the level for the addressed segment, and the endpoint must then allow or disallow the request based on the secure level.

- The XMC must match the secure level of the endpoint with the secure level of the segment matched. If they mismatch, the XMC faults the request.
- The secure ROM only accepts secure requests and reports itself as secure.
- The Multicore Shared Memory Controller (MSMC) keeps a "secure address threshold" that is programmable by a secure supervisor only, and will only allow secure requests that are above the secure threshold.
- Emulation requests are only allowed for a secure segment if the segment is marked emulable, thus introducing the concept of secure emulation at the system level.

Security in this implementation is ultimately enforced by the secure endpoints. The system provides a mechanism to extend the chain of trust from the fixed ROM and the effectively fixed eFuse key values to establish and maintain security.

Address translation may be done via adding an address offset, or by bit replacement. The described implementation uses bit-replacement to save silicon area and increase the likelihood of meeting timing constrains. A lower clock-rate implementation (or a more aggressive implementation at the same clock rate) could use address-offset.

Address extension is implemented in the preferred embodiment by bit replacement. The upper address bits of the logical address are replaced with the corresponding bits from the replacement address (RADDR). The replacement address field may be wider than the field it replaces, thus extending the addressing range. In the current implementation the 32 bit logical address space is extended to a 36 bit physical address space. Table 6 shows the bits replaced, depending on segment size (SEGSZ).

TABLE 7

| SEGSZ | RADDR[23:x] |
|---|---|
| 00000b | Seg. disabled |
| 00001b | Reserved |
| 00010b | Reserved |
| 00011b | Reserved |
| 00100b | Reserved |
| 00101b | Reserved |
| 00110b | Reserved |
| 00111b | Reserved |
| 01000b | Reserved |
| 01001b | Reserved |
| 01010b | Reserved |
| 01011b | 0 |
| 01100b | 1 |
| 01101b | 2 |
| 01110b | 3 |
| 01111b | 4 |
| 10000b | 5 |
| 10001b | 6 |

TABLE 7-continued

| SEGSZ | RADDR[23:x] |
|---|---|
| 10010b | 7 |
| 10011b | 8 |
| 10100b | 9 |
| 10101b | 10 |
| 10110b | 11 |
| 10111b | 12 |
| 11000b | 13 |
| 11001b | 14 |
| 11010b | 15 |
| 11011b | 16 |
| 11100b | 17 |
| 11101b | 18 |
| 11110b | 19 |
| 11111b | 20 |

FIG. 6 shows the layout of the segment registers. There is a segment register for each memory segment, 16 in the preferred implementation. The registers occupy two 32 bit words shown as 601 and 602 in the memory map, although not all 64 bits are implemented in the current implementation. The fields in the segment registers are described in Table 8.

TABLE 8

| Field | Name | Meaning |
|---|---|---|
| BADDR | Base Address | Upper bits of address range to match in the 32-bit logical address space |
| SEGSZ | Segment Size | Segment size. Table 9 shows encoding. |
| RADDR | Replacement Address | Bits that replace and extend the upper address bits matched by BADDR |
| PERM | Permissions | Access types allowed in this address range. |

The segment size (SEGSZ) is encoded as show in Table 9, and the 8 permission and emulation control bits are described in tables 4 and 5.

TABLE 9

| SEGSZ | Meaning |
|---|---|
| 00000b | Disabled |
| 00001b | Rsvd (Disabled) |
| 00010b | Rsvd (Disabled) |
| 00011b | Rsvd (Disabled) |
| 00100b | Rsvd (Disabled) |
| 00101b | Rsvd (Disabled) |
| 00110b | Rsvd (Disabled) |
| 00111b | Rsvd (Disabled) |
| 01000b | Rsvd (Disabled) |
| 01001b | Rsvd (Disabled) |
| 01010b | Rsvd (Disabled) |
| 01011b | 4 KB |
| 01100b | 8 KB |
| 01101b | 16 KB |
| 01110b | 32 KB |
| 01111b | 64 KB |
| 10000b | 128 KB |
| 10001b | 256 KB |
| 10010b | 512 KB |
| 10011b | 1 MB |
| 10100b | 2 MB |
| 10101b | 4 MB |
| 10110b | 8 MB |
| 10111b | 16 MB |
| 11000b | 32 MB |
| 1100b | 64 MB |
| 11010b | 128 MB |
| 11011b | 256 MB |
| 11100b | 512 MB |
| 11101b | 1 GB |
| 11110b | 2 GB |
| 11111b | 4 GB |

Figure 7:
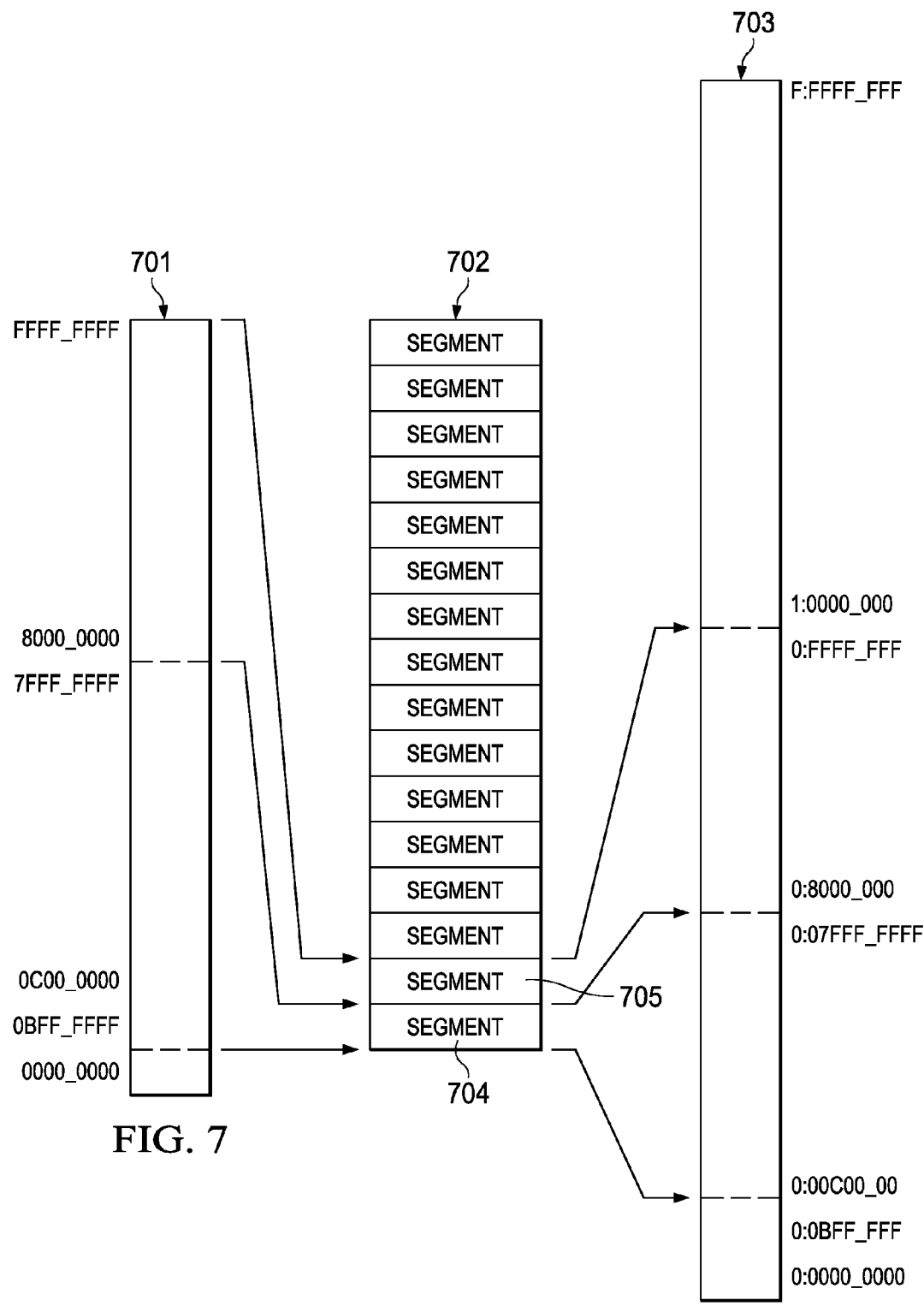
FIG. 7 illustrates an example of a memory map with segment mapping and address extension.

FIG. 7 shows a memory map of a typical system. 701 represents a 32 bit addressable logical memory being mapped into the 36 bit address space of the available physical memory 703. Mapping and address translation is implemented in two of the segment registers in register block 702. In the mapping shown in FIG. 7, segment register 704 contains BADDR=00000h; RADDR=000000h; and SEGSZ=11110b representing 2 GB. Register 705 contains BADDR=80000h; RADDR=080000h; and SEGSZ=11110b.

Figure 8:
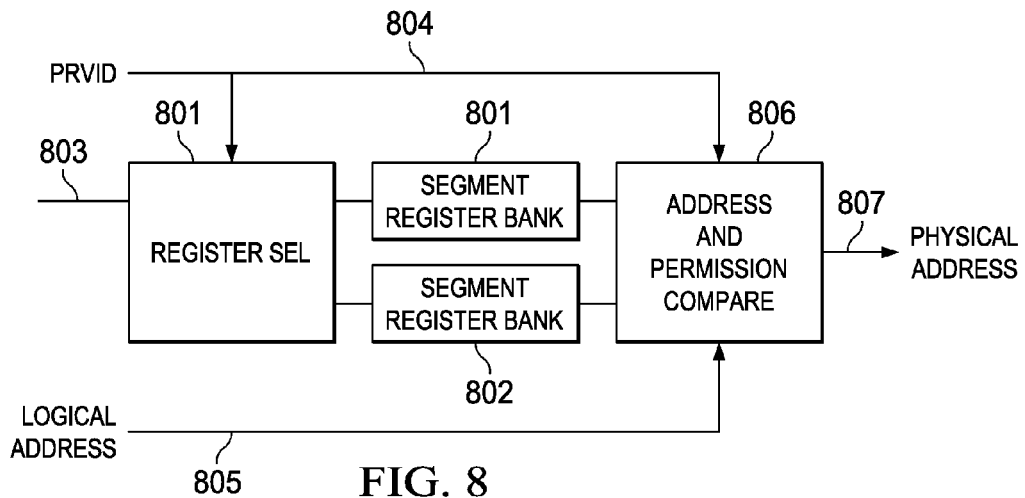
FIG. 8 illustrates part of the extended memory controller.

FIG. 8 shows a high level description of one implementation of the Extended Memory Controller. Register bank select block 803 selects the appropriate segment register bank from segment register banks 801 or 802 by looking at the PRVID 804 accompanying the memory request. Comparator block 806 then selects the requested segment register by comparing logical address 805 to the segment base addresses and segment sizes in the appropriate segment registers, and then compares the permission bits of the selected segment register to the permissions associated with logical address 805 as communicated by PRVID 804. If the comparison indicates a valid memory request, block 806 generates physical address 807 by replacing the appropriate bits in logical address 805 by the corresponding bits in the replacement address field RADDR of the selected segment register.

The exact number of segments, segment register banks and the range of segment sizes are not fundamental to this invention. In the current preferred embodiments we have 8 or 16 segments, and segment sizes from 4 KB to 4 GB. One could easily envision a lower cost realization with fewer segments, a larger smallest-segment size, or no address extension.

What is claimed is:

1. A memory management system comprising:
  a memory organizes as a plurality of memory segments, each memory segment including a corresponding address range of a logical address space of the memory;
  a plurality of segment registers, each segment register corresponding to one of the memory segments, each segment register storing an indication of said address range of said corresponding memory segment and an indication of each allowable ID (AID) permitted to access the corresponding memory segment;
  a plurality of mapping registers equal in number to a number of privilege IDs, each mapping register storing an indication of an AID associated with a corresponding privilege ID; and
  an extended memory controller connected to said memory, said plurality of memory segments and said plurality of mapping registers, said memory controller, said memory controller receiving requests for memory access from requestors specifying a memory address to be accessed and a privilege ID of said requestor, said memory controller operable to
    compare the memory address of a received request with the stored indication of address range of each segment register to identify a segment register corresponding to a memory segment sought to be accessed,
    access said plurality of mapping registers to determine an AID corresponding to the received privilege ID of a request,
    determine from the identified segment register and the determined AID whether a received request is permitted to access the corresponding memory segment, and
    permit access to said memory only if the privilege ID of a request maps to a permitted AID for the corresponding memory segment.

2. The memory management system of claim 1, wherein:
  said privilege ID consists of 4 bits;
  said AID consists of 3 bits; and
  said plurality of mapping registers consists of 16 mapping registers each storing a corresponding AID of 3 bits.

3. The memory management system of claim 2, wherein:
  said mapping registers are readable by all requestors with all privilege IDs.

4. The memory management system of claim 3, wherein:
  said mapping registers are only writeable by supervisors or by emulation.

5. The memory management system of claim 1, wherein:
  each segment register includes an indication whether a secure mode is required for access to said corresponding memory segment indicating said memory segment is a secure memory segment;
  said extended memory controller is further operable to permit a request for memory access to a secure memory segment only if said request for memory access is a thread executing from a secure memory segment;
  said mapping registers are only writeable by secure supervisors.

6. The extended memory controller of claim 5, wherein:
  said mapping registers further store a one bit wide field that specifies whether the requestor associated with the corresponding privilege ID is allowed to initiate a secure transaction into the memory segment.

* * * * *